(12) United States Patent
Gassner et al.

(10) Patent No.: US 9,391,222 B2
(45) Date of Patent: Jul. 12, 2016

(54) FRAME FOR A PLATE-SHAPED SOLAR ELEMENT

(71) Applicant: tesa SE, Hamburg (DE)

(72) Inventors: Thomas Gassner, Heidgraben (DE); Michael Schwertfeger, Hamburg (DE)

(73) Assignee: TESA SE, Norderstedt (DE)

( * ) Notice: Subject to any disclaimer, the term of this patent is extended or adjusted under 35 U.S.C. 154(b) by 253 days.

(21) Appl. No.: 14/269,310

(22) Filed: May 5, 2014

(65) Prior Publication Data
US 2014/0237933 A1 Aug. 28, 2014

Related U.S. Application Data

(62) Division of application No. 12/490,003, filed on Jun. 23, 2009, now abandoned.

(30) Foreign Application Priority Data

Jul. 7, 2008 (DE) .......................... 10 2008 031 545

(51) Int. Cl.
*F24J 2/02* (2006.01)
*H01L 31/048* (2014.01)
(Continued)

(52) U.S. Cl.
CPC ............. *H01L 31/048* (2013.01); *F24J 2/464* (2013.01); *F24J 2/465* (2013.01); *F24J 2/4612* (2013.01); *F24J 2/4614* (2013.01); *F24J 2/5211* (2013.01); *H01L 31/18* (2013.01); *H02S 20/00* (2013.01); *F24J 2002/4676* (2013.01); *Y02B 10/20* (2013.01); *Y02E 10/47* (2013.01); *Y02E 10/50* (2013.01); *Y10T 29/49355* (2015.01)

(58) Field of Classification Search
CPC .......... H01L 31/048; H01L 31/18; F24J 2/02; B23P 15/26
USPC .................. 126/680, 570, 664; 136/256, 251; 52/788, 201; 428/141
See application file for complete search history.

(56) References Cited

U.S. PATENT DOCUMENTS 4,454,703 A 6/1984 Sitzler et al.
5,367,843 A * 11/1994 Hirai ....................... F24J 2/045
126/621

(Continued)

FOREIGN PATENT DOCUMENTS

CN 1622343 A 6/2005
DE 2546069 A1 4/1977
(Continued)

OTHER PUBLICATIONS

English translation of Notification for the Opinion of Examination and Search Report issued by the Taiwanese Patent Office in corresponding application No. 098120392 Jun. 9, 2014.

*Primary Examiner* — Gregory Huson
*Assistant Examiner* — Nikhil Mashruwala
(74) *Attorney, Agent, or Firm* — Norris McLaughlin & Marcus, P.A.

(57) ABSTRACT

The invention relates to a frame for a plate-shaped solar element. The frame includes a bottom frame element (21) with a first surface (24) and a top frame element (11) with a second surface (14). The second surface (14) is disposed opposite the first surface (24) and is at spaced from the first surface forming a gap that accommodates an edge region of the plate-shaped solar element (31). The first surface and the second surface are each self-adhesive.

7 Claims, 5 Drawing Sheets

(51) Int. Cl.
 *F24J 2/46* (2006.01)
 *F24J 2/52* (2006.01)
 *H01L 31/18* (2006.01)
 *H01L 31/042* (2014.01)

(56) References Cited

U.S. PATENT DOCUMENTS

| | | | |
|---|---|---|---|
| 5,478,402 | A | 12/1995 | Hanoka |
| 5,762,720 | A | 6/1998 | Hanoka et al. |
| 5,836,117 | A | 11/1998 | Johnson |
| 6,300,555 | B1 * | 10/2001 | Kondo ............... H01L 31/048 136/244 |
| 6,662,523 | B2 | 12/2003 | Hornung et al. |
| 2005/0115603 | A1 | 6/2005 | Yoshida et al. |
| 2009/0025710 | A1 | 1/2009 | Hogan |
| 2009/0229654 | A1 * | 9/2009 | Morita ............... F24J 2/4614 136/251 |
| 2011/0232737 | A1 | 9/2011 | Ruletzki et al. |
| 2012/0079781 | A1 * | 4/2012 | Koller ............... F24J 2/5207 52/173.3 |

FOREIGN PATENT DOCUMENTS

| | | |
|---|---|---|
| DE | 7634735 U1 | 11/1979 |
| DE | 2847176 A1 | 5/1980 |
| DE | 29516754 U1 | 1/1996 |
| DE | 29804410 U1 | 5/1998 |
| DE | 10000856 A1 | 7/2001 |
| DE | 20109727 U1 | 9/2001 |
| DE | 20209218 U1 | 10/2002 |
| EP | 1 009 037 A1 | 6/2000 |
| FR | 2371646 | 6/1978 |
| FR | 2448696 A1 | 9/1980 |
| JP | 2005 076340 A | 3/2003 |

* cited by examiner

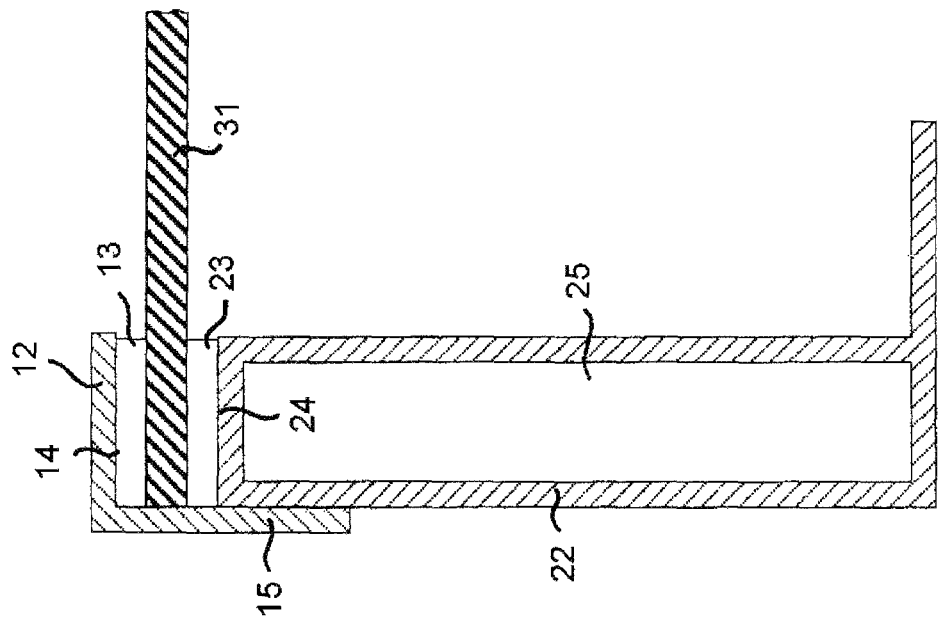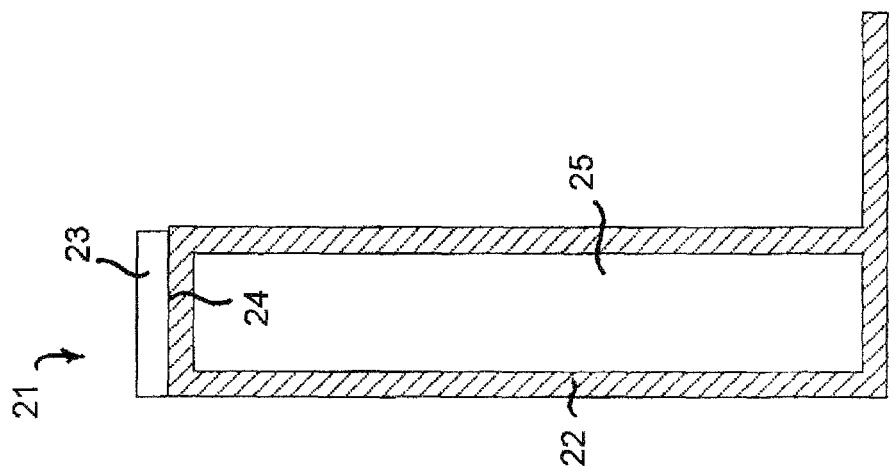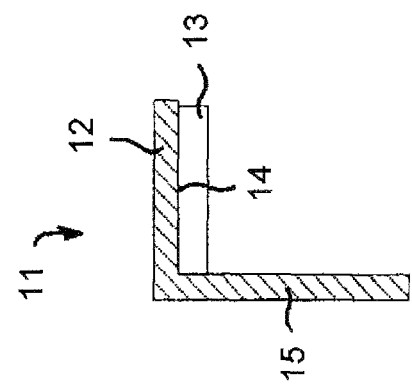

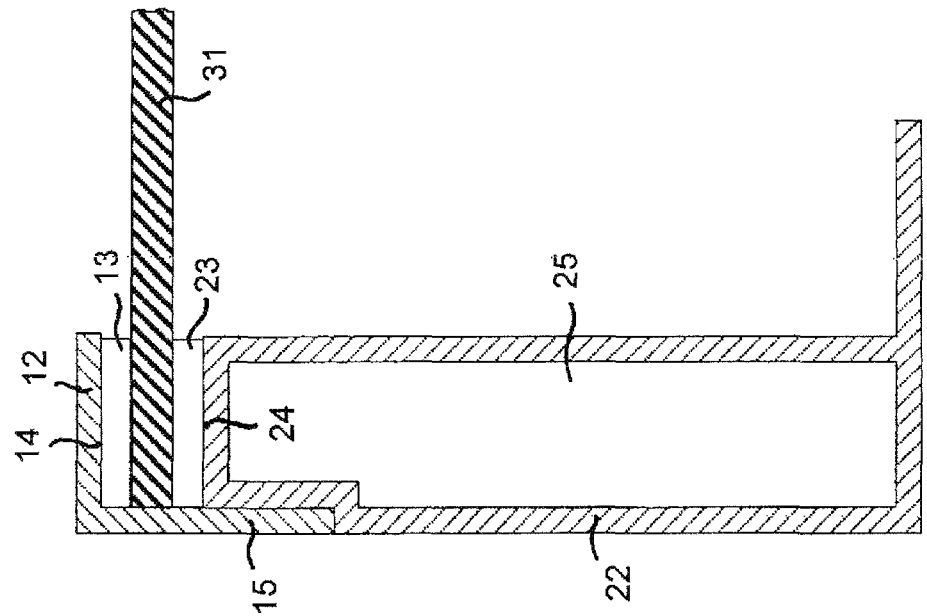
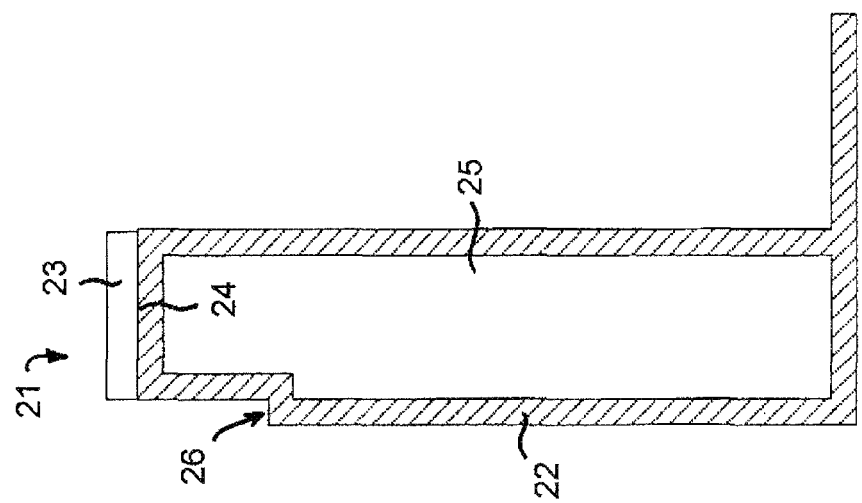
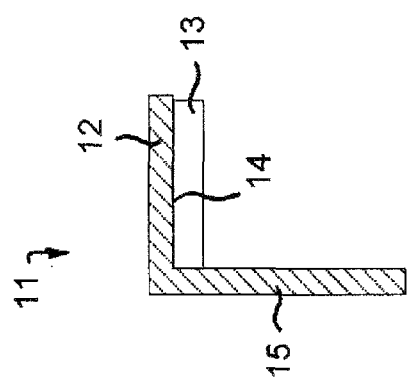

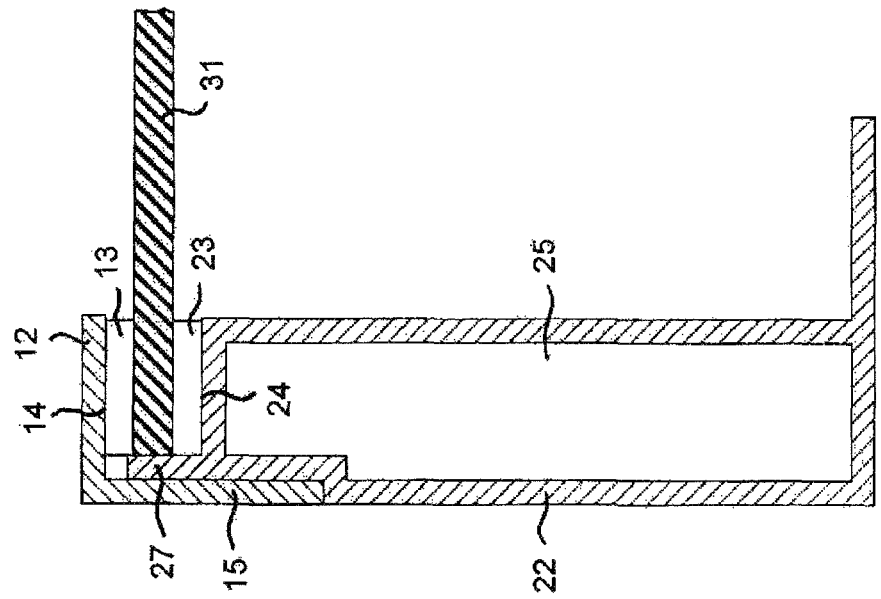
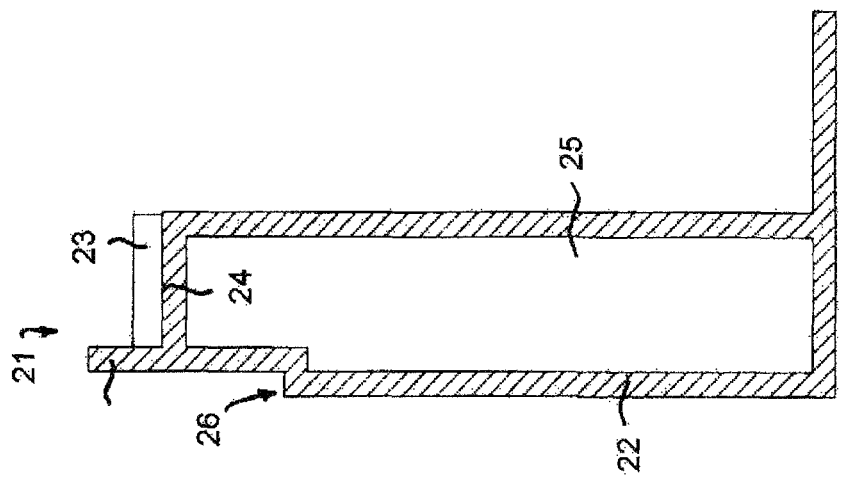
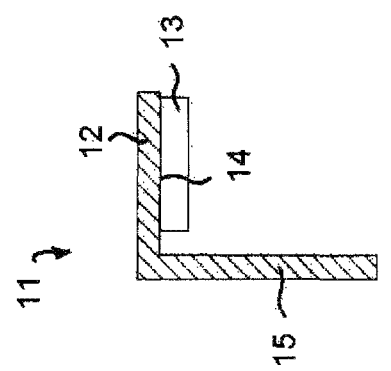

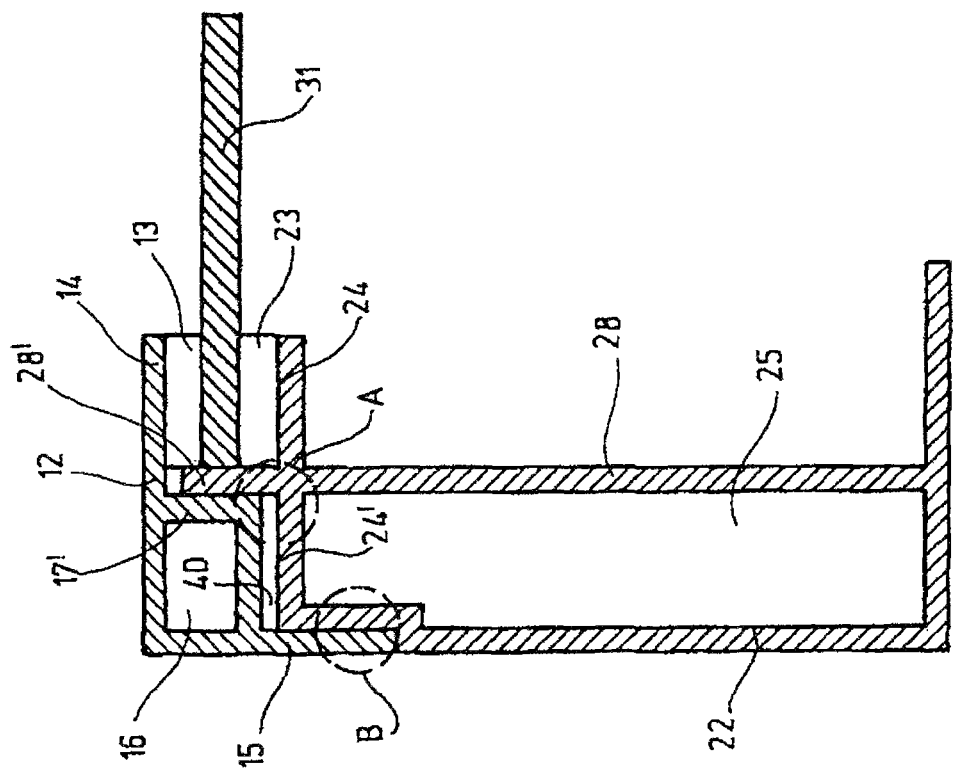
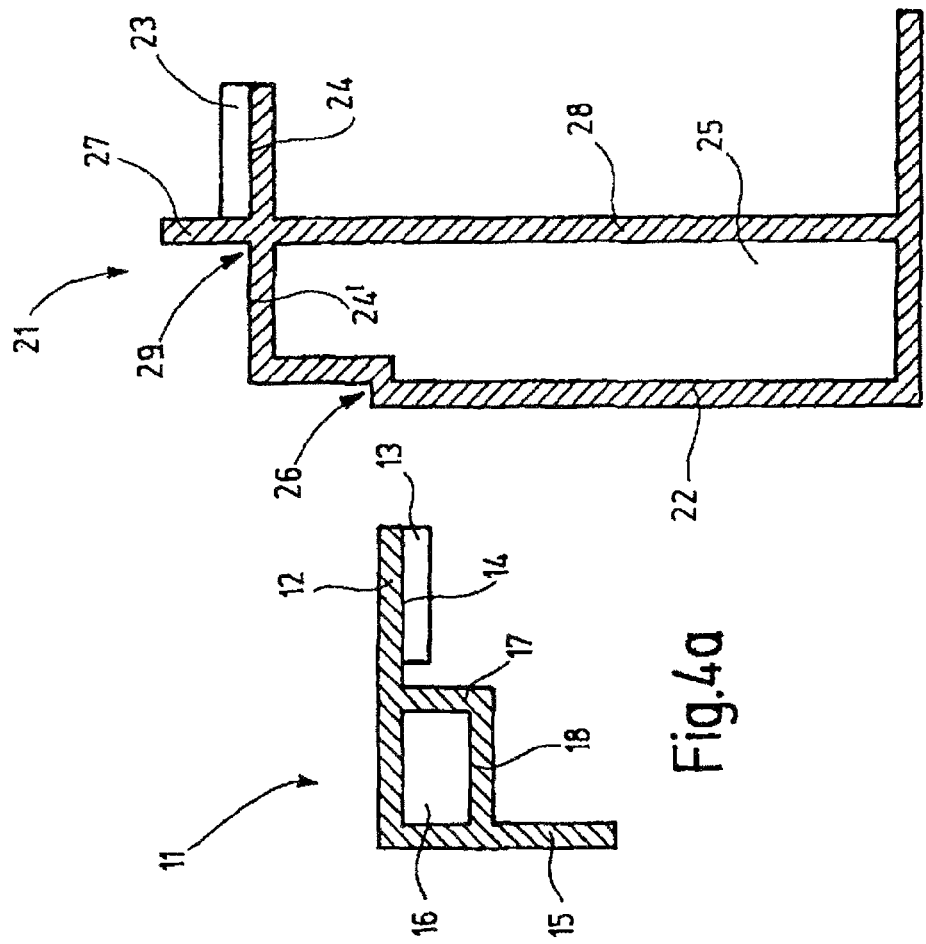

FRAME FOR A PLATE-SHAPED SOLAR ELEMENT

This application is a division of U.S. Nonprovisional application Ser. No. 12/490,003, filed Jun. 23, 2009, now pending, which, in turn, claims priority of German Patent Application No. 10 2008 031 545.1, filed Jul. 7, 2008, the entire contents of which patent applications are incorporated herein by reference.

BACKGROUND OF THE INVENTION (1) Field of the Invention

The invention relates to a frame for a plate-shaped solar element and to the use of such a frame for producing a solar module.

Solar modules consist of a frame that surrounds the solar element, which, as a rule, comprises a plurality of solar cells arranged in one plane and embedded in a plastics material foil. The plastics material foil, as a rule, is covered by a glass plate and has a lamination on the rear side that is conventionally also produced from plastics material. The solar element, which is occasionally also referred to as a frameless solar module or laminate, is surrounded by a frame, which has the effect of strengthening the solar element, protects the solar element, in particular the glass panel, during transport and makes it possible for solar elements to be secured to buildings and structures. The framed solar element, as a rule, is referred to as the solar module.

(2) Description of Related Art

According to the state of the art one-piece frames are generally used. Such a frame is pressed laterally onto the outside edges of the solar element and the edges of the solar module are then stuck down manually. This method of operation is inefficient.

Also known are two-piece frames, which include a bottom frame element, onto which the solar element is placed. The actual frame is obtained by a top frame element being pressed into the bottom frame element obtaining a friction-locking or positive-locking connection, a gap being realized between the bottom and the top frame element, into which the edge region of the solar element is inserted.

DE 202 09 218 U1 discloses a two-piece frame for a frameless solar module, said frame including a bottom frame element with a surface onto which the solar module is placed. In addition, a slot is provided in the bottom frame element, a portion of a top angular frame element being inserted into said slot, thereby obtaining a positive-locking and/or friction-locking connection between the two frame elements. Before the solar module is placed into the frame, the edge region of the solar module is enveloped in a resilient material, for example a seal, which after the assembly is positioned between the frame and the solar module. The production of such a frame and the application of the seal, however, are time-consuming and costly.

BRIEF SUMMARY OF THE INVENTION

It is the object of the invention to eliminate the disadvantages of the state of the art. In particular, it aims to provide a frame for accommodating a plate-shaped solar element which makes a more efficient and more economic framing of solar elements possible.

This object is achieved through the features described hereinbelow.

A frame for a plate-shaped solar element is provided according to the invention, said frame comprising a bottom frame element with a first surface and preferably a top frame element with a second surface, wherein the second surface is situated opposite the first surface and is at a spacing from said first surface forming a gap that can accommodate the edge region of the plate-shaped solar element, wherein the first surface and the second surface are each self-adhesive. Preferably, in this case, the first surface is provided with a first adhesive strip and the second surface is provided with a second adhesive strip. The frame can also comprise just a bottom frame element with a second surface, in which case a top frame element can be omitted.

The first and the second adhesive strip are expediently double-sided adhesive strips, preferably double-sided foam adhesive strips. In this case, the double-sided adhesive strip on the first surface (first double-sided adhesive strip) has an inside adhesive layer that is in contact with the first surface, whilst the outside adhesive layer faces the second surface of the top frame element. The double-sided adhesive strip on the second surface (second double-sided adhesive strip) also has an inside adhesive layer that is in contact with the second surface, whilst the outside adhesive layer faces the first surface of the bottom frame element.

The first and the second frame element can be produced from the same or different materials. According to a preferred specific embodiment, the bottom and the top frame element are produced from a weather-resistant material, such as, for example, aluminum or other suitable materials.

The term solar element refers here to the laminate that surrounds the solar cells. The solar element is frameless. The term solar module refers here to the framed solar element, i.e. the solar element that has been inserted into the frame.

The two-piece frame according to the invention makes it possible, on account of the finish on the two surfaces that are in contact with the edge region of the plate-shaped solar element, to dispense with a seal on the one hand and with manual sticking down on the other. This means that there are no time-consuming, expensive, unwieldy sticking down processes directly on the solar module at all and this simplifies the mounting of the solar element into a frame in a considerable manner. The two adhesive strips assume, in addition to the sealing of the solar module against the effects of the weather, the function of the connection between top and bottom frame element, the adhesive friction locking being generated by the solar element. In addition, the two frame elements can be additionally interconnected through an optional positive-locking and/or friction-locking connection. The assembly procedure is simplified by the frame according to the invention such that, along with the currently conventional assembly in production halls, even assembly on site is now also conceivable. In this case, initially the bottom frame element is fixedly assembled at the point of destination and then the solar element and the top frame element are assembled as described below.

The two frame elements are provided with the adhesive strip during their production, the surface of the first and of the second adhesive strip that do not come into contact with the first or respectively the second surface, each being provided with a covering. These coverings are only removed when the solar module is mounted.

To produce the solar module, first the covering is removed from the adhesive layer that is situated on the first surface of the bottom frame element. Then the bottom side of the plate-shaped solar element is placed, in its edge region, onto the adhesive layer that is situated on the first surface of the bottom frame element, an adhesive connection thereby being realized between the bottom frame element and the solar element. Then the top frame element is mounted onto the plate-shaped solar element in such a manner that the adhesive layer, which is situated on the second surface of the top frame element and from which the covering had previously been removed, comes into contact with the top side of the plate-shaped solar element in its edge region. This means that an adhesive connection is realized between the top frame element and the solar element.

Once the plate-shaped solar element is inserted into the frame, the bottom side of the plate-shaped solar element is in contact, in its edge region, with the adhesive layer of the first adhesive strip and the top side of the solar module is in contact, in its edge region, with the adhesive layer of the second adhesive strip.

The bottom frame element preferably includes an abutment edge for the plate-shaped solar element, said abutment edge extending from the first surface in the direction of the second surface and outwardly defining the gap that is realized between the first surface and the second surface. The abutment edge makes it possible to position the solar element on the second surface in a precise manner.

In addition, the bottom frame element can include a recess that is realized on the outside of the frame and orthogonally relative to the first surface, and the top frame element can have a portion that can be introduced into the recess obtaining a positive-locking and/or friction-locking connection, wherein the portion is realized orthogonally relative to the second surface of the top frame element and extends from said second surface in the direction of the bottom frame element. A smooth outside edge of the frame is obtained in this manner.

In an expedient manner, both the bottom frame element and the top frame element are each made up of part elements, wherein the part elements are interconnected by means of connecting elements. The plate-shaped solar element is typically rectangular such that the bottom and the top frame element are each made up of four part elements, adjacent part elements of the respective frame element being positioned at right angles one to another. The part elements are preferably profiled elements that have profiled hollow spaces. Connecting elements, for example commercially available corner joints that can be inserted in a positive-locking manner into the profiled hollow spaces, are provided for connecting adjacent part elements. The contour of the first surface of the bottom frame element and the contour of the second surface of the top frame element consequently correspond to the edge region of the solar element. The profiled elements are preferably pre-manufactured profiled elements that have been mitred and cut to predetermined lengths, which means that assembling the frame is very simple. In addition, all the necessary bores, such, for example, as are necessary for mounting a solar module on buildings and structures, are already admitted into the two frame elements. The mounting of the self-adhesive finish, in particular the two adhesive strips, can be effected in an automated procedure.

Between the bottom frame element and the top frame element there can be a drainage channel to drain off water. The bottom side of the drainage channel is preferably formed by a groove, which is realized in a region of the first surface of the bottom frame element that is not covered by the first double-sided adhesive strip and is at a spacing from the same in the direction of the outside edge of the frame. The drainage channel has two essential functions: on the one hand, to compensate for various expansions of the components in the event of fluctuating temperatures and, on the other hand, where necessary, to drain off any penetrating moisture. In addition, drainage bores can be realized in the bottom frame element and/or in the top frame element.

The use of the frame according to the invention for producing a solar module is also provided according to the invention. The solar module is assembled as follows: Once the bottom frame element has been assembled from the part elements, the covering of the first adhesive strip is removed and the solar element is placed from above onto the first surface. The correct, reproducible positioning is preferably effected by means of the abutment edge, which ensures that the solar element is not stuck down to the bottom frame element in the wrong position. The pre-assembled top frame element is then pushed from above onto the bottom frame with the solar element. In this case too, the covering of the second adhesive strip had also been removed first of all.

BRIEF DESCRIPTION OF THE SEVERAL VIEWS OF THE DRAWING(S)

The invention is described in more detail below by way of drawings, in which:

FIG. 1a is a sectional representation of a part element of the top frame element in accordance with a first specific embodiment of the frame according to the invention;

FIG. 1b is a sectional representation of a part element of the bottom frame element in accordance with the first specific embodiment of the frame according to the invention;

FIG. 1c is a sectional representation of the bottom and of the top frame element in accordance with the first specific embodiment together with the solar element after the assembly forming the solar module;

FIG. 2a is a sectional representation of a part element of the top frame element in accordance with a second specific embodiment of the frame according to the invention;

FIG. 2b is a sectional representation of a part element of the bottom frame element in accordance with the second specific embodiment of the frame according to the invention;

FIG. 2c is a sectional representation of the bottom and of the top frame element in accordance with the second specific embodiment together with the solar element after the assembly forming the solar module;

FIG. 3a is a sectional representation of a part element of the top frame element in accordance with a third specific embodiment of the frame according to the invention;

FIG. 3b is a sectional representation of a part element of the bottom frame element in accordance with the third specific embodiment of the frame according to the invention;

FIG. 3c is a sectional representation of the bottom and of the top frame element in accordance with the third specific embodiment together with the solar element after the assembly forming the solar module;

FIG. 4a is a sectional representation of a part element of the top frame element in accordance with a fourth specific embodiment of the frame according to the invention;

FIG. 4b is a sectional representation of a part element of the bottom frame element in accordance with the fourth specific embodiment of the frame according to the invention;

FIG. 4c is a sectional representation of the bottom and of the top frame element in accordance with the fourth specific embodiment together with the solar element after the assembly forming the solar module.

DETAILED DESCRIPTION OF THE INVENTION

Figure 5:
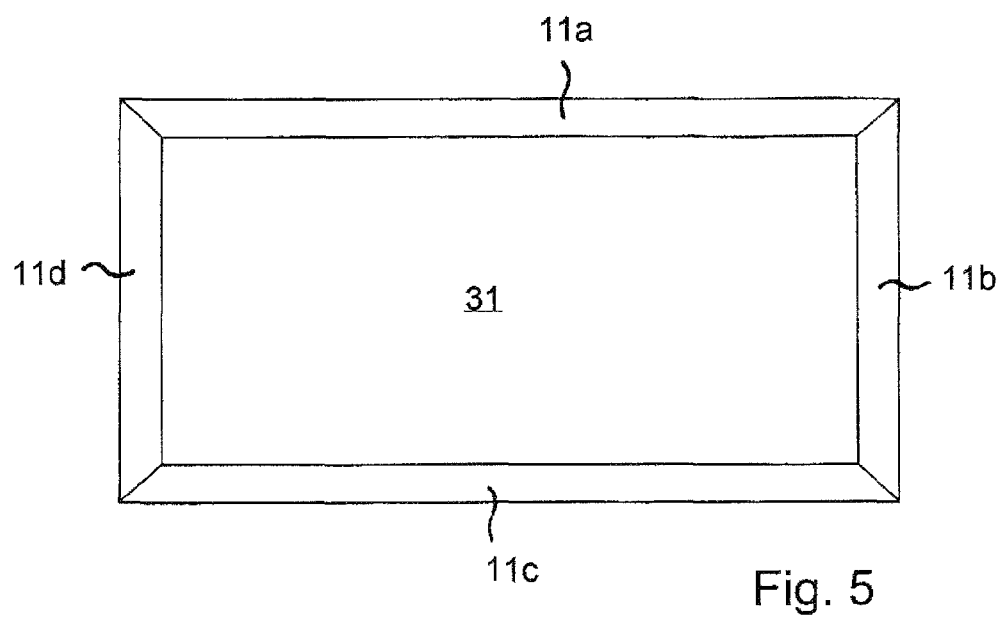
FIG. 5 is a top view of the solar module.

FIG. 1a shows the top frame element 11 of a first specific embodiment of the frame according to the invention. The top frame element 11 has an angular cross-section, the second surface 14, which is provided with an adhesive strip 3, being realized on the bottom side of the first portion 12. The second portion 15, which abuts against an end face of the first portion 12, is realized orthogonally relative to the first portion 12. When the frame has been assembled, the second portion 15 rests on the outside 22 of the bottom frame element 21.

The bottom frame element 21 (FIG. 1b) has a first surface 24, which is provided with an adhesive strip 23. The top frame element 21 also includes a hollow space 25, into which corner joints (not shown) can be inserted in a positive-locking manner in order to interconnect several bottom frame elements 21.

FIG. 1c shows the frame mounted on the plate-shaped solar element 31. It is clear that the bottom side of the solar element 31 rests, in its edge region, on the adhesive strip 23 that is situated on the first surface 24 of the bottom frame element 21, the bottom side of the solar module 31 thereby being stuck to the bottom frame element 21. The top frame element 11 is stuck, in its edge region, to the top side of the solar module 31 by means of the adhesive strip 13 that is situated on the second surface 14, such that the second portion 15 of the top frame element 11 abuts against the outside 22 of the bottom frame element 21.

FIGS. 2a to 2c show a second specific embodiment of the frame according to the invention, which is extensively similar to the first specific embodiment. Additionally, there is a recess 26 provided in the upper region of the outside 22 of the bottom frame element 21 that abuts against the first surface 24. The recess 26 is dimensioned such that it can accommodate the second portion 15 of the top frame element 11. A stepless outside edge of the frame is obtained in this manner. The remaining references have the same meaning as in FIGS. 1a to 1c. By the bottom frame element 21 having the recess 26 realized on the outside of the frame and orthogonally relative to the first surface 24, a positive-locking and/or friction-locking connection is created. This friction-locking connection can also be obtained by means of a snap-type or locking-type connection, for example, if, in place of the recess 26 on the frame element 21, a groove is realized, in which a bead-like section on the portion 15 engages, locks or snaps, the portion preferably having to be developed in a resilient-elastic manner.

With the third specific embodiment of the frame according to the invention, shown in FIGS. 3a to 3c, in addition to the features of the second specific embodiment (see FIGS. 2a to 2c), a web 27 is provided on the bottom frame element 21, said web extending from the first surface 24 of the bottom frame element 21 in the direction of the second surface 14 and outwardly defining the gap that is realized between the first surface 24 and the second surface 14. The web 27 forms an abutment edge for the plate-shaped solar element 31. The outside of the web 27 and the outside 22 of the bottom frame element 21 are situated in the region of the recess 26 preferably in one plane. The remaining references have the same meaning as in FIGS. 2a to 2c.

FIGS. 4a to 4c show a fourth specific embodiment of the frame according to the invention, where both the bottom frame element 21 (as in the first three specific embodiments represented) and the top frame element 11 are realized as hollow profiles. This makes it possible to connect a plurality of top frame elements 11 by means of positive-locking corner joints (not shown) that are inserted into the hollow spaces 16 of the top frame element 11. The hollow space 16 is obtained by a web 17 being realized extending parallel to the second portion 15 and at a spacing from the second portion 15 in the direction of the second surface 14. The web 17, which is shorter than the second portion 15, begins on the bottom side of the first portion 12 and opens out in another web 18, which extends parallel to the first portion 18, but is shorter than said first portion. The additional web 18 begins on the inside of the portion 15 and ends in the web 17.

Deviating from the first three specific embodiments represented, the recess 26 of the bottom frame element 21 is dimensioned such that it only accommodates that part of the second portion 15 that is situated below the bottom side of the web 18. The bottom frame element 21 also has a recess 29, which is defined downwards by a surface 24' that is realized on the side of the web 27 that is remote from the first surface 24. Surface 24 and surface 24' are preferably situated in one plane. The extension of the surface 24 from the web 27 in the direction of the outside of the frame in this case corresponds to the length of the web 18 of the top frame element 11. The length of the web 17 of the top frame element is smaller than or equal to the length of the web 27, such that the recess 29 is filled out by the edges of the top frame element that define the opening 18. The web 27 must not contact the surface of the web 14. The clearance established by the air gap 40 is defined by the length of the portion 15, it also being possible for an air gap to be realized between the webs 28' and 17' (FIG. 4c). The outsides of the web 27 are aligned relative to inside wall 28 of the bottom frame element. A drainage channel can be realized in the region A. Drainage bores can be provided in the region B. The remaining references have the same meaning as in FIGS. 3a to 3c.

FIG. 5 shows a top view of a solar module that shows a frame according to the invention. It is clear that the top frame element is made up of four part elements 11a, 11b, 11c, 11d. The bottom frame element is also made up of four part elements (not shown).

What is claimed is:

1. A frame adapted for use with a plate-shaped solar element, comprising
   a bottom frame element comprises a first surface having a first adhesive strip, and a recess disposed on the outside of the frame and orthogonally relative to the first surface,
   and a top frame element comprises profiled part element interconnected by connecting elements, the top frame element having a second surface having a second adhesive strip which is a double-sided adhesive strip that has an inside adhesive layer that is in contact with the second surface, and an outside adhesive layer that faces the first surface of a bottom frame element, and the top frame element has a portion that is adapted to be inserted into the recess and thereby obtaining a positive-locking and/or friction-locking connection, and the portion is realized orthogonally relative to the second surface of the top frame element and extends from said second surface in the direction of the bottom frame element
   wherein the second surface is situated opposite the first surface and is at a spacing from said first surface forming a gap that can accommodate the edge region of the plate-shaped solar element, and
   further wherein a drainage channel is present between the bottom frame element and the top frame element and a bottom side of the drainage channel is formed by a groove which is disposed in a region of the first surface of the bottom frame element that is not self-adhesive and is at a spacing from the self-adhesive strip in the direction of the outside edge of the frame, and drainage bores are disposed in the bottom frame element and/or in the top frame element.

2. The frame according to claim 1, wherein the first adhesive strip is a double-sided adhesive strip that has an inside adhesive layer that is in contact with the first surface, and an outside adhesive layer that faces the second surface of the on frame element.

3. The frame according to claim 1, wherein, when an edge region of the plate-shaped solar element is inserted into the frame, the edge region of the bottom side of the plate-shaped solar element is in contact with the adhesive layer of the first adhesive strip and the edge region of the top side of the solar module is in contact with the adhesive layer of the second adhesive strip.

4. The frame according, claim 1, wherein the bottom frame element includes an abutment edge extending from the first surface in the direction of the second surface.

5. The frame according to claim 1, wherein the bottom frame element is comprised of profiled part elements which are interconnected by connecting elements.

6. The frame according to claim 1, wherein the part elements each comprise hollow spaces into which the connecting elements are inserted.

7. A method for producing a solar module, comprising a step of: providing a plate-shaped solar element within a frame according to claim 1.

* * * * *